(12) United States Patent
Liao et al.

(10) Patent No.: US 12,151,849 B2
(45) Date of Patent: Nov. 26, 2024

(54) MODEL CHANGING METHOD AND BATTERY TRAY

(71) Applicant: ZHUHAI TITANS NEW POWER ELECTRONICS CO., LTD, Guangdong (CN)

(72) Inventors: Xiaowen Liao, Guangdong (CN); Xinhua Huang, Guangdong (CN); Zhou Zhang, Guangdong (CN)

(73) Assignee: ZHUHAI TITANS NEW POWER ELECTRONICS CO., LTD, Guangdong (CN)

( * ) Notice: Subject to any disclaimer, the term of this patent is extended or adjusted under 35 U.S.C. 154(b) by 0 days.

(21) Appl. No.: 18/544,381

(22) Filed: Dec. 18, 2023

(65) Prior Publication Data
US 2024/0116674 A1  Apr. 11, 2024

Related U.S. Application Data

(63) Continuation of application No. PCT/CN2023/100974, filed on Jun. 19, 2023.

(30) Foreign Application Priority Data

Sep. 28, 2022  (CN) .......................... 202211196813.3

(51) Int. Cl.
*B65D 19/44* (2006.01)
*B65D 19/00* (2006.01)
*H05K 13/00* (2006.01)

(52) U.S. Cl.
CPC ......... *B65D 19/44* (2013.01); *B65D 19/0002* (2013.01); *H05K 13/00* (2013.01)

(58) Field of Classification Search
CPC ..... H05K 13/00; Y02E 60/10; H01M 50/209; B65D 2585/88; B65D 19/0002
See application file for complete search history.

(56) References Cited

U.S. PATENT DOCUMENTS

| 2010/0167116 A1* | 7/2010 | Okada ................ H01M 50/574 429/158 |
| 2013/0118124 A1 | 5/2013 | Cheah |

(Continued)

FOREIGN PATENT DOCUMENTS

| CN | 202264995 U | 6/2012 |
| CN | 202743619 U | 2/2013 |

(Continued)

OTHER PUBLICATIONS

CN-217281098-U Translation (Year: 2024).*

(Continued)

*Primary Examiner* — Don M Anderson
*Assistant Examiner* — Justin Caudill
(74) *Attorney, Agent, or Firm* — PV IP PC; Wei Te Chung (57) ABSTRACT

The present application a model changing method and a battery tray. The model changing method includes: limiting a limited member by a pair of limiting assemblies, where each of the limiting assemblies is provided with a first limiting surface and a second limiting surface; disposing two first limiting surfaces of the pair of limiting assemblies opposite each other to form a first accommodating cavity; and disposing two second limiting surfaces of the pair of limiting assemblies opposite each other to form a second accommodating cavity, where a length of the first accommodating cavity is not equal to that of the second accommodating cavity.

10 Claims, 8 Drawing Sheets

(56) References Cited

U.S. PATENT DOCUMENTS

| | | | | |
|---|---|---|---|---|
| 2013/0189559 A1* | 7/2013 | Giere | ................ | H01M 10/655 |
| | | | | 429/120 |
| 2013/0295429 A1* | 11/2013 | Makie | ................ | H01M 50/213 |
| | | | | 429/100 |
| 2014/0103182 A1* | 4/2014 | Ouchi | ................ | B65D 19/0002 |
| | | | | 248/346.02 |
| 2015/0333305 A1* | 11/2015 | Seki | ................ | H01M 10/625 |
| | | | | 429/152 |
| 2016/0240826 A1* | 8/2016 | Oota | ................ | H01M 50/213 |
| 2019/0013500 A1* | 1/2019 | Sakurai | ............... | H01M 50/296 |
| 2021/0365917 A1 | 11/2021 | Tusia Cohen | | |

FOREIGN PATENT DOCUMENTS

| | | | | |
|---|---|---|---|---|
| CN | 103038872 | A | | 4/2013 |
| CN | 208868489 | U | | 5/2019 |
| CN | 213736370 | U | | 7/2021 |
| CN | 214730866 | U | | 11/2021 |
| CN | 215184177 | U * | 12/2021 | ........... G01R 31/385 |
| CN | 217261609 | U | | 8/2022 |
| CN | 217281098 | U * | 8/2022 | |
| CN | 115489844 | A | | 12/2022 |
| JP | H06144482 | A | | 5/1994 |
| JP | 2014061940 | A | | 4/2014 |

OTHER PUBLICATIONS

International Search Report in International application No. PCT/CN2023/100974, mailed on Jun. 19, 2023.

Written Opinion of the International Search Authority in International application No. PCT/CN2023/100974, mailed on Sep. 14, 2023.

Chiese First Office Action and Search Report in application No. 202211196813.3, mailed on Apr. 27, 2023.

Chiese Second Office Action in application No. 202211196813.3, mailed on Jun. 22, 2023.

* cited by examiner

MODEL CHANGING METHOD AND BATTERY TRAY

CROSS-REFERENCE TO RELATED APPLICATIONS

This application is a continuation of International Application No. PCT/CN2023/100974, filed on Jun. 19, 2023, which claims priority to and the benefit of Chinese Patent Application No. 202211196813.3, filed with on Sep. 28, 2022. The disclosures of the aforementioned applications are incorporated herein by reference in their entireties.

TECHNICAL FIELD

The present application relates to the field of battery production equipment technologies, and more particularly, to a model changing method and a battery tray.

BACKGROUND

In various processing, such as drawing, formation, and capacity grading, of a battery production process, a tray is often used to transport a battery and load the battery into the tray for processing. However, there are various models of batteries each having a different battery size. In order to be compatible with various sizes of batteries, it is common at the present stage to clamp the batteries with different sizes of separators. The separators are intended to be compatible with different widths of batteries. The separators are configured to clamp the different widths of batteries, thereby being compatible with the different widths of batteries. However, if a clamping force of each of the separators to one of the batteries is excessively large, the battery may be easily damaged, and if the clamping force is excessively small, the battery may be easily deflected due to unstable clamping of the battery.

If a plurality of separators having different sizes each are redesigned to limit a length of each of the batteries, not only is the cost greatly increased, but also a separator storage area for storing the separators needs to be reserved at a factory.

Further, if a mechanical arm is used to replace the separator for limiting the length of the battery, it is necessary to provide a separator replacement area, in which a desired separator is manually screened out from the separator storage area, and then dispatched to the separator replacement area and clamped by the mechanical arm, which involves complicated operations. Even so, however, the clamping and mounting of the separators by the mechanical arm is greatly tested due to the separators having different sizes.

SUMMARY

In a first aspect, the present application provides a model changing method, including:
limiting a limited member by a pair of limiting assemblies, wherein each of the limiting assemblies is provided with a first limiting surface and a second limiting surface; disposing two first limiting surfaces of the pair of limiting assemblies opposite each other to form a first accommodating cavity, where the first accommodating cavity has a length of L1; and adjusting a state of the pair of limiting assemblies so that two second limiting surfaces of the pair of limiting assemblies are disposed opposite each other to form a second accommodating cavity, where the second accommodating cavity has a length of L2, and L1 is not equal to L2.

In a second aspect, the present application provides a battery tray, including a separator assembly and at least one pair of limiting assemblies, where the separator assembly comprises a supporting structure and at least two separators, the supporting structure is connected to the at least two separators, each of the limiting assemblies is provided with a first limiting surface and a second limiting surface, the at least one pair of limiting assemblies is connected to the supporting structure or the separators, two first limiting surfaces of the pair of limiting assemblies are disposed opposite each other to form a first accommodating cavity in combination with the two ones of the separators, the first accommodating cavity has a length of L1, or two second limiting surfaces of the pair of limiting assemblies are disposed opposite each other to form a second accommodating cavity in combination with two ones of the separators, the second accommodating cavity has a length of L2, and L1 is not equal to L2.

REFERENCE SIGNS

Pallet 100, Baffle 110, Guide rod 120, Driving assembly 130, Separator 200, Breathable hole 210, Limiting assembly 300, First mounting portion 310, Limiting portion 320, First limiting surface 330, Second limiting surface 340, First accommodating cavity 400, Second accommodating cavity 500, and Fixing block 600.

DETAILED DESCRIPTION

Embodiments of the present application are described in detail below. Examples of the embodiments are shown in the drawings, in which the same or similar reference numerals indicate the same or similar components or components having the same or similar functions. The embodiments described below by reference to the accompanying drawings are exemplary and are merely illustrative of the present application and are not to be construed as limiting the present application.

In the description of the present application, it should be understood that orientations or position relationships referred to in the description of the orientation indicated by the terms "upper", "lower", "front", "rear", "left", "right" are based on orientations or position relationships illustrated in the drawings. The terms are used to facilitate and simplify the description of the present application, rather than indicate or imply that the devices or elements referred to herein are required to have specific orientations or be constructed or operate in the specific orientations. Accordingly, the terms should not be construed as limiting the present application.

In the description of the present application, the meaning of "plurality" is two or more. If the terms "first", "second" are described for the purpose of distinguishing technical features only, it is not to be construed as indicating or implying relative importance or implicitly indicating the number of indicated technical features or implicitly indicating the order of the indicated technical features.

In the description of the present application, unless expressly defined otherwise, terms "arrangement", "installation", "connection", and the like are to be understood in a broad sense, and those skilled in the art may reasonably determine the specific meaning of the above terms in the present application in connection with the specific contents of the technical solution.

Figure 1:
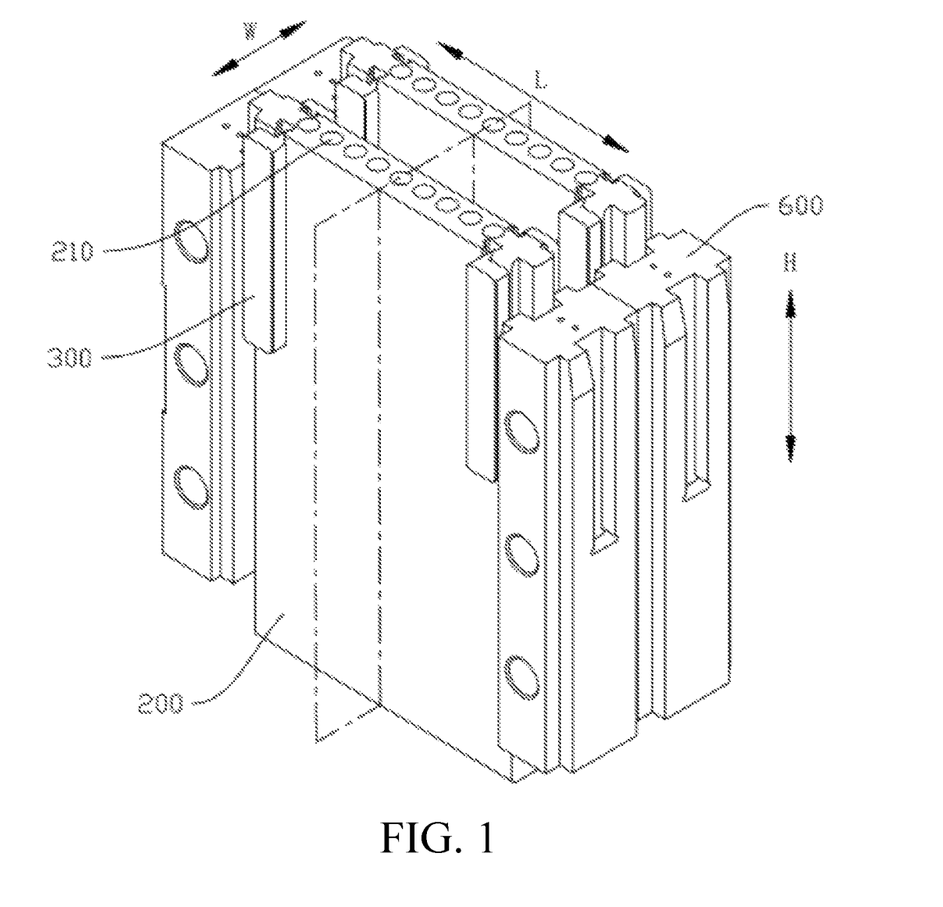
FIG. 1 shows a schematic structural diagram of a separator, a limiting assembly and a fixing block in a battery tray according to some embodiments of the present application.

As shown in FIG. 1, an accommodating cavity described in the present application has a length direction of L, a width direction of W, and a height direction of H. A central plane of the first accommodating cavity 400 or the second accommodating cavity 500 is a plane shown by a dashed line.

Referring to FIGS. 1-5, the present application discloses a model changing method, including: limiting a limited member by a pair of limiting assemblies 300, where each of the pair of limiting assemblies 300 is provided with a first limiting surface 330 and a second limiting surface 340; two first limiting surfaces 330 of the pair of limiting assemblies 300 are disposed opposite each other and form a first accommodating cavity 400 having a length of L1; and adjusting a state of the pair of limiting assemblies 300 so that two second limiting surfaces 340 of the pair of limiting assemblies 300 are disposed opposite each other and form a second accommodating cavity 500 having a length of L2, where L1 is not equal to L2.

It can be understood that a pair of limiting assemblies 300 should include an even number of limiting assemblies 300, such as two, four, etc. The state of the pair of limiting assemblies 300 includes changing a position of each limiting assembly 300 in the pair of limiting assemblies 300 only, or changing an orientation of each limiting assembly 300 in the pair of limiting assemblies 300 only, to implement limiting of two ends of each of limited members having different sizes by the pair of limiting assemblies 300. It should be understood that, in order to more equalize a force exerted by the limited member, the pair of limiting members 300 are disposed axially and symmetrically, i.e., the pair of limiting members 300 are disposed symmetrically with respect to the central plane of the first accommodating cavity 400 or the second accommodating cavity 500, where the central plane is extended in the height direction of the first accommodating cavity 400 or the second accommodating cavity 500.

In addition, the first accommodating cavity 400 and the second accommodating cavity 500 are disposed opposite each other. The first accommodating cavity 400 and the second accommodating cavity 500 described herein are not limited in the present application, as long as the length L1 of the first accommodating cavity 400 is not equal to the length L2 of the second accommodating cavity 500. That is, when the length L1 is greater than the length L2, the first accommodating cavity 400 compatible with a large-sized limited member can be switched to the second accommodating cavity 500 compatible with a small-sized limited member by the model changing method of the present application. Similarly, when L1 is less than L2, the first accommodating cavity 400 compatible with the small-sized limited member can be switched to the second accommodating cavity 500 compatible with the large-sized limited member by the model changing method of the present application.

The accommodating cavities having different sizes can be formed by the state of the pair of limiting members 300, thereby being compatible with limited members having different sizes. The method is simple and can conveniently and quickly limit the limited members. Further, since it is necessary to perform adjustment of the same pair of limiting assemblies 300, that is, structures and sizes of the limiting assemblies 300 remain unchanged, it is advantageous to adjust the clamping force of the mechanical arm and the travel of the mechanical arm when the limiting assemblies 300 are scheduled by the mechanical arm, thereby facilitating implementation of automatic model changing with the mechanical arm to accommodate the limited members having different sizes. The limiting assemblies 300 are formed of a section bar.

The first limiting surface 330 and the second limiting surface 340 are two end surfaces of the same limiting assembly 300 that face away from each other. In one state, the first limiting surface 330 of one limiting member 300 is opposite to the first limiting surface 330 of another limiting member 300, and an area between the two first limiting surfaces 330 is defined as the first accommodating cavity 400, and the two first limiting surfaces 330 form two side walls of the first accommodating cavity 400 in the length direction of the first accommodating cavity 400. In another state, the second limiting surface 340 of one limiting member 300 is opposite to the second limiting surface 340 of another limiting member 300, and an area between the two second limiting surfaces 340 is defined as the second accommodating cavity 500, and the two second limiting surfaces 340 form two side walls of the second accommodating cavity 500 in the length direction of the second accommodating cavity 500.

Figure 2:
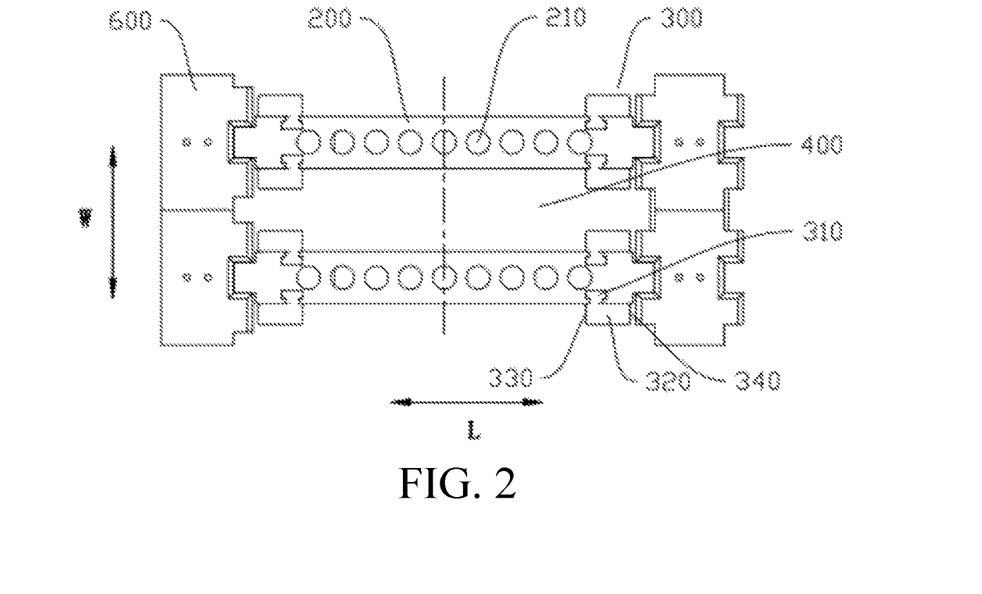
FIG. 2 shows a schematic structural diagram of a first accommodating cavity in a first implementation of a battery tray according to some embodiments of the present application.
Figure 3:
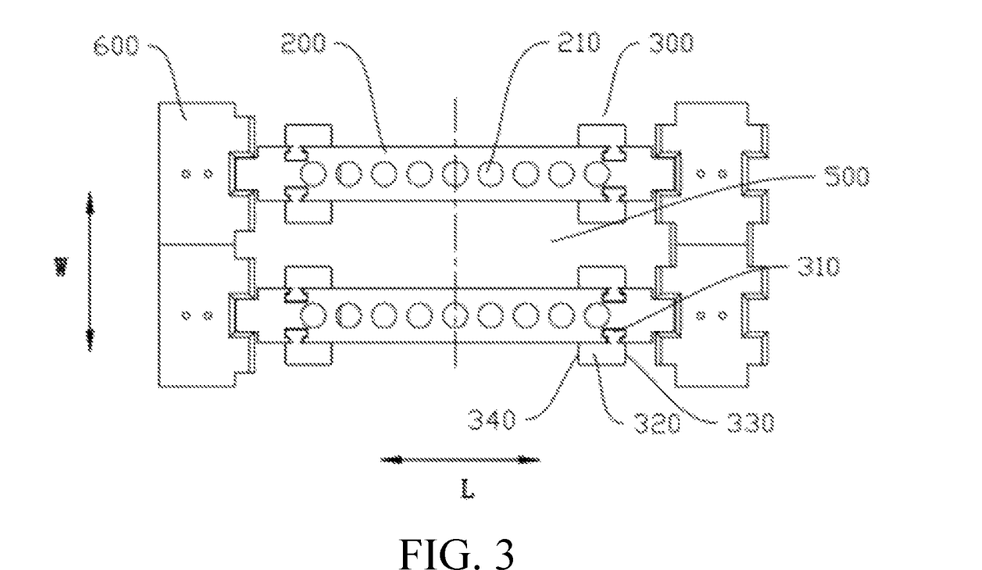
FIG. 3 shows a schematic structural diagram of a second accommodating cavity in the first implementation of the battery tray according to some embodiments of the present application.

Referring to FIGS. 2 and 3, a pair of limiting assemblies 300 are located at a first position and a second position, respectively, and adjusting the state of the pair of limiting assemblies 300 includes moving one limiting assembly 300 located at the first position to the second position and moving another limiting assembly 300 located at the second position to the first position, such that the two second limiting surfaces 340 of the pair of limiting assemblies 300 are disposed opposite each other and form the second accommodating cavity 500. Switching of the first accommodating cavity 400 and the second accommodating cavity 500 can be realized by the position interchanging of the pair of the limiting members 300, thereby implementing limiting of the limited members having different sizes.

It can be envisioned that the step of moving the one limiting assembly 300 located at the first position to the second position and moving the another limiting assembly 300 located at the second position to the first position may be implemented by simultaneously clamping the limiting assemblies 300 respectively located at the first position and the second position with two mechanical arms for position interchanging and simultaneously placing the position interchanged limiting assemblies 300 into the first position and the second position.

The step of moving the one limiting assembly 300 located at the first position to the second position and moving the another limiting assembly 300 located at the second position to the first position may be further implemented by moving the another limiting assembly 300 located at the second position to a third position, i.e., an outer area of the first accommodating cavity 400 or the second accommodating cavity 500, then moving the one limiting assembly 300 located at the first position to the second position, and then moving the another limiting assembly 300 located at the third position to the first position, so that the two second limiting surfaces 340 of the pair of limiting assemblies 300 are disposed opposite each other and form the second accommodating cavity 500. As a transition position, the third position is provided in the outer area of the first accommodating cavity 400 or the second accommodating cavity 500, so that there is no obstacle to a scheduling operation. With this arrangement, the position interchanging of the one limiting assembly 300 located at the first position and the another limiting assembly 300 located at the second position can be implemented by one mechanical arm, which is a simple operation. Preferably, the third position is parallel to the first position and the second position. After the mechanical arm clamps the limiting assemblies, only translation is required to complete the interchanging. A path of the interchanging is simple, and the accuracy of the interchanging is improved.

It should be noted that the first position and the second position are opposite, and the first position and the second position described herein are not limited in the present application. That is, in the embodiment shown in FIG. 2, if the first position is located at one end of the first accommodating cavity 400 or the second accommodating cavity 500 in the length direction of the first accommodating cavity 400 or the second accommodating cavity 500, the second position is located at another end of the first accommodating cavity 400 or the second accommodating cavity 500 in the length direction of the first accommodating cavity 400 or the second accommodating cavity 500, and vice versa.

Figure 4:
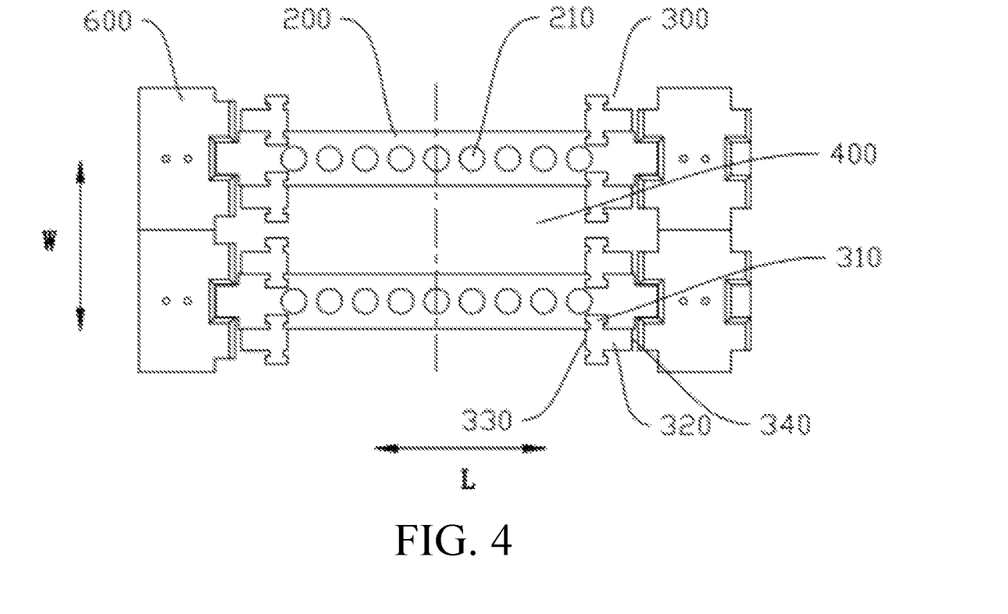
FIG. 4 shows a schematic structural diagram of a first accommodating cavity in a second implementation of a battery tray according to some embodiments of the present application.
Figure 5:
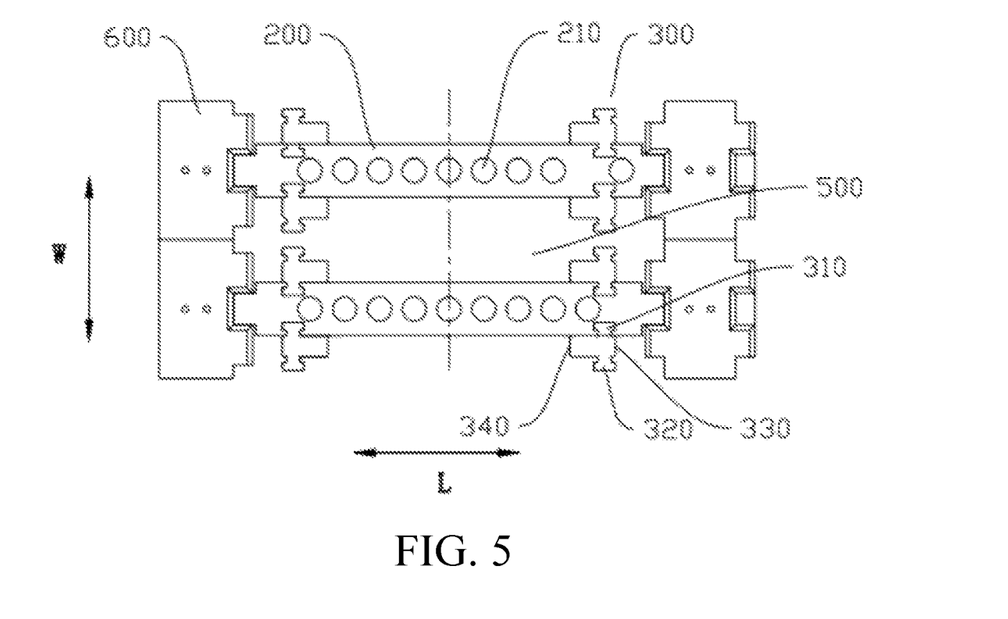
FIG. 5 is a schematic structural diagram of a second accommodating cavity in the second implementation of the battery tray according to some embodiments of the present application.

Referring to FIGS. 4 and 5, each of the pair of limiting assemblies 300 has a first axis extending in the height direction of the first accommodating cavity 400, and adjusting the state of the pair of limiting assemblies 300 is further implemented by rotating the pair of limiting assemblies 300 by 180° with respect to the first axis as a rotation axis so that the two second limiting surfaces 340 of the pair of limiting assemblies 300 are disposed opposite each other and form the second accommodating cavity 500.

It can be understood that each of the pair of limiting assemblies 300 has the first axis, and that switching between the first accommodating cavity 400 and the second accommodating cavity 500 can be implemented in such a manner that each limiting assembly 300 is rotated with respect to its own first axis without interchanging the positions of the pair of limiting assemblies 300.

Referring to FIGS. 2 and 3, each of the pair of limiting assemblies 300 has a second axis extending in the width direction of the first accommodating cavity 400, and adjusting the state of the pair of limiting assemblies 300 is further implemented by rotating the pair of limiting assemblies 300 by 180° with respect to the second axis so that the two second limiting surfaces 340 of the pair of limiting assemblies 300 are disposed opposite each other and form the second accommodating cavity 500.

It should be understood that each of the pair of limiting assemblies 300 has the second axis, and that switching between the first accommodating cavity 400 and the second accommodating cavity 500 can be implemented in such a manner that each limiting assembly 300 is rotated with respect to its own second axis without interchanging the positions of the pair of limiting assemblies 300.

It can be envisioned that an angle of M degree is formed between the first limiting surface 330 and the second limiting surface 340, or that an angle of M degree is formed between the elongated line of the first limiting surface 330 and the elongated line of the second limiting surface 340. The pair of limiting members 300 each have a third axis extending in the height direction of the first accommodating cavity 400, and adjusting the state of the pair of limiting assembly 300 is further implemented by rotating one limiting assembly 300 by N degree with respect to the forward direction of its third axis and another limiting assembly 300 by N degree with respect to the reverse direction of its third axis, so that the two second limiting surfaces 340 of the pair of limiting assemblies 300 are disposed opposite each other and form the second accommodating cavity 500, where N=180°−M, 0°<M<180°.

An example in which M=90° is taken. Referring to FIGS. 6, 7, 10, and 11, the first limiting surface 330 and the second limiting surface 340 are perpendicular to each other, and each of the pair of limiting assemblies 300 has a third axis extending in the height direction of the first accommodating cavity 400. The adjusting the state of the pair of limiting assemblies 300 is further implemented by rotating one limiting assembly 300 by 90° with respect to the forward direction of its third axis and rotating another limiting assembly 300 by 90° with respect to the reverse direction of its third axis, so that the two second limiting surfaces 340 of the pair of limiting assemblies 300 are disposed opposite each other and form the second accommodating cavity 500.

One of the forward and reverse directions is clockwise and the other is counterclockwise.

Of course, M can also be other angles, such as 20°, 30°, 45°, 120°, etc., and can be selected depending on an actual requirement.

Each of the above-described model changing methods requires first withdrawing the pair of limiting assemblies 300 from the first accommodating cavity 400, adjusting the state of the pair of limiting assemblies 300, and then inserting the pair of limiting assemblies 300 to form the second accommodating cavity 500.

It should be explained that the positioning reference of the pair of limiting assemblies 300 forming the first accommodating cavity 400 and the second accommodating cavity 500 remains unchanged, and the first axis, the second axis and the third axis in the above-described model changing method only define their respective extending directions. That is, after the state of the pair of limiting assemblies 300 is adjusted, there are two cases including: one case in which the positioning references of the pair of limiting assemblies 300 before and after the adjustment are collinear, in which case the pair of limiting assemblies 300 can be directly inserted to form the second accommodating cavity 500; another case in which the positioning references of the pair of limiting assemblies 300 before and after the adjustment are not collinear, in which case it is necessary to translate the pair of limiting assemblies 300 by a distance and then insert the pair of limiting assemblies 300 to form the second accommodating cavity 500.

Referring to FIG. 1 to FIG. 3, the present application also discloses a battery tray, including at least one pair of limiting assemblies 300 and a separator assembly. The separator assembly includes a supporting structure and at least two separators 200, where the supporting structure is connected to the at least two separators 200. Each of the limiting assemblies 300 is provided with a first limiting surface 330 and a second limiting surface 340. The at least one pair of limiting assemblies 300 is connected to the supporting structure or the separators 200. Two first limiting surfaces 330 of the pair of limiting assemblies 300 are disposed opposite each other to form the first accommodating cavity 400 in combination with the two ones of the separators 200, where the length of the first accommodating cavity 400 is L1. Alternatively, two second limiting surfaces 340 of the pair of limiting assemblies 300 are disposed opposite each other to form the second accommodating cavity 500 in combination with the two ones of the separators 200, where the length of the second accommodating cavity 500 is L2, and L1 is not equal to L2.

When the two first limiting surfaces 330 of the pair of limiting assemblies 300 are disposed opposite each other, the pair of limiting assemblies 300 and the two ones of the separators 200 enclose each other to form the first accommodating cavity 400. The first accommodating cavity 400 is configured for limiting a battery, and the two first limiting surfaces 330 of the pair of limiting assemblies 300 and the two separators are side walls of the first accommodating cavity 400. When the two second limiting surfaces 340 of the pair of limiting assemblies 300 are disposed opposite each other, the pair of limiting assemblies 300 and the two ones of the separators 200 enclose each other to form the second accommodating cavity 500. The second accommodating cavity 500 is configured for limiting a battery, and the two first limiting surfaces 340 of the pair of limiting assemblies 300 and the two separators are side walls of the second accommodating cavity 500. Since L1 is not equal to L2, the batteries limited by the first accommodating cavity 400 and the second accommodating cavity 500, respectively, have different sizes, so that the battery tray is compatible with the batteries having different sizes.

For a manufacturer, application of the battery tray has following advantages. First, it is necessary to only adjust the state of the limiting assemblies 300 so that the battery tray can carry and limit batteries having different sizes without additionally adding the storage area for storing the limiting assemblies 300 having various sizes, thereby avoiding such a case that an excessive factory space is occupied by the storage area. Second, since it is not necessary to schedule limiting assemblies 300 having different sizes over a long distance, the complexity of the logistics line can be reduced. Third, central positions of the first accommodating cavity 400 and the second accommodating cavity 500 formed before and after the adjustment of the state of the limiting assemblies 300 remain unchanged, that is, the positioning reference remains unchanged, so as to facilitate adjustment of production equipment to operate the batteries having different sizes and further ensure that the production process of the batteries having different sizes can be effectively performed. Fourth, the lengths of the batteries are limited by the limiting assemblies 300, and the widths of the batteries are limited by the separators 200, thereby reducing the possibility of position deviation of the batteries in the battery tray.

Each of the limiting assemblies 300 includes a first mounting portion 310 and a limiting portion 320. The first mounting portion 310 is connected to the limiting portion 320 and configured to be connected with the supporting structure or the separators 200. The first limiting surface 330 and the second limiting surface 340 are two end surfaces of the same limiting portion 320 that are disposed opposite each other or perpendicular to each other, that is, two end surfaces of the first accommodating cavity 400 or the second accommodating cavity 500 in the length direction of the first accommodating cavity 400 or the second accommodating cavity 500. The first mounting portion 310 and the limiting portion 320 have relatively simple structures and do not interfere with each other.

A sliding rail and a sliding block mechanism mutually matched with each other are formed between the first mounting portion 310 and the supporting structure or the separator 200 so as to facilitate connection and disconnection between the first mounting portion 310 and the supporting structure or the separator 200.

The first mounting portion 310 and the limiting portion 320 of the limiting assembly 300 may be in the shape of L as shown in FIGS. 2 and 3, or in the shape of T as shown in FIGS. 4 and 5, or may be in the shape of trapezoid, rectangle, or the like.

Figure 10:
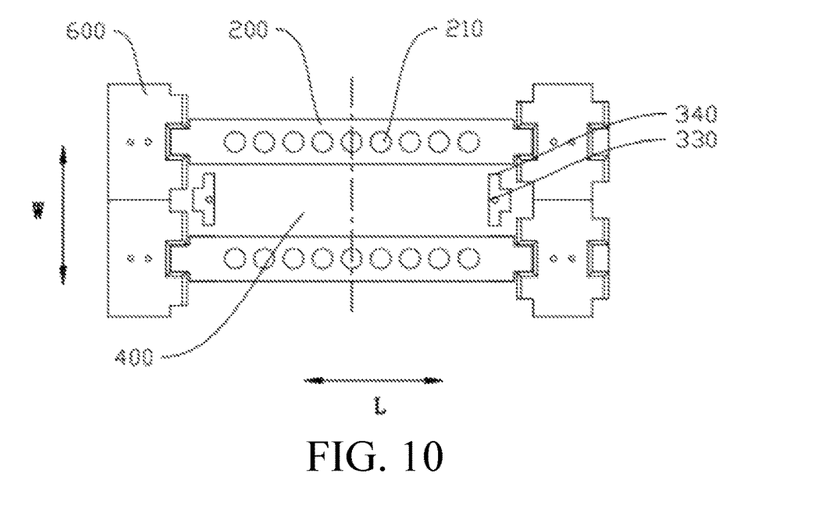
FIG. 10 shows a schematic structural diagram of a first accommodating cavity in a fourth implementation of a battery tray according to some embodiments of the present application.
Figure 11:
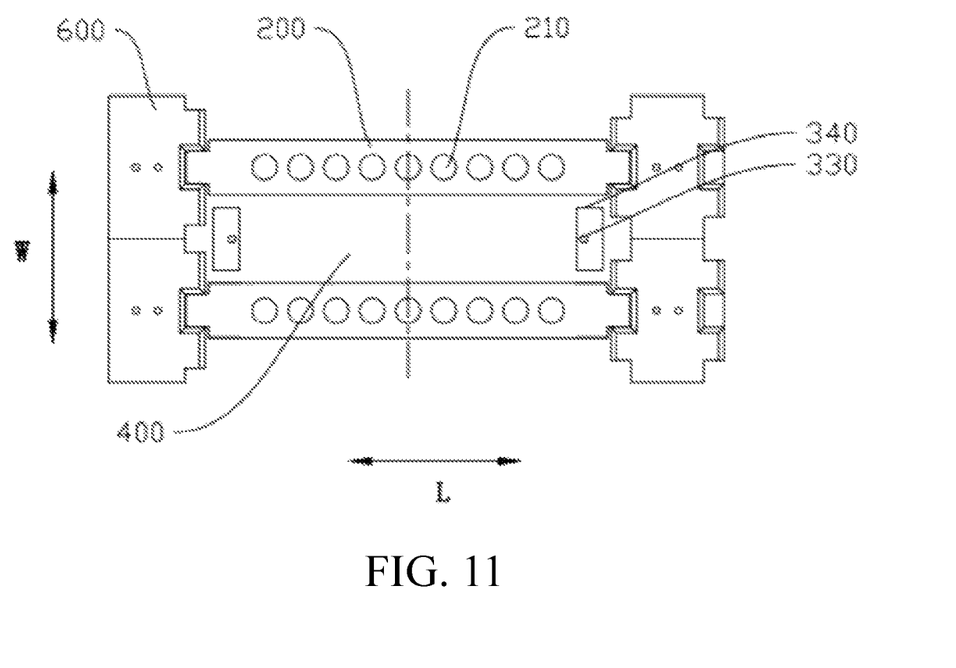
FIG. 11 shows a schematic structural diagram of a first accommodating cavity in a fifth implementation of a battery tray according to some embodiments of the present application.

The limiting assembly 300 may be in the shape of T as shown in FIG. 10 and rectangle as shown in FIG. 11. The first mounting portion 310 of the limiting assembly 300 is provided as a vertical mounting through-hole or a mounting column, and the mounting through-hole or mounting column is provided on the limiting portion 320. Of course, in order to avoid rotation of the limiting assembly 300 relative to the mounting portion 310 when the battery abuts, the mounting through-hole and the mounting column may also be provided with corresponding limiting grooves to position the limit assembly 300 in different mounting states.

That is, when a mounting center surface of the first mounting portion 310 connected with the supporting structure and/or the separator is used as a connection reference, the mounting center surface extends in the height direction of the first accommodating cavity 400 or the second accommodating cavity 500, and a distance between the first limiting surface 330 and the connection reference is not equal to that between the second limiting surface 340 and the connection reference. That is, it can be implemented after installation of the limiting assemblies 300 that the length L1 of the first accommodating cavity 400 is not equal to the length L2 of the second accommodating cavity 500.

In one embodiment, referring to FIGS. 2 to 5, the first limiting surface 330 and the second limiting surface 340 are two end surfaces of the same limiting portion 320 disposed opposite each other, that is, two end surfaces of the first accommodating cavity 400 or the second accommodating cavity 500 in the length direction of the first accommodating cavity 400 or the second accommodating cavity 500. Preferably, the first limiting surface 330 and the second limiting surface 340 are parallel to each other.

In another embodiment, the first limiting surface 330 and the second limiting surface 340 are two end surfaces of the same limiting portion 320 adjacent and perpendicular to each other. Referring to FIGS. 10 and 11, the limiting assembly 300 includes a first mounting portion 310 and a limiting portion 320. The first mounting portion 310 is provided on the limiting portion 320, and the limiting portion 320 is provided with a first limiting surface 330 and a second limiting surface 340, where the first limiting surface 330 and the second limiting surface 340 are disposed adjacent to each other, and a distance between the first limiting surface 330 and the first mounting portion 310 is not equal to that between the second limiting surface 340 and the first mounting portion 310.

Figure 6:
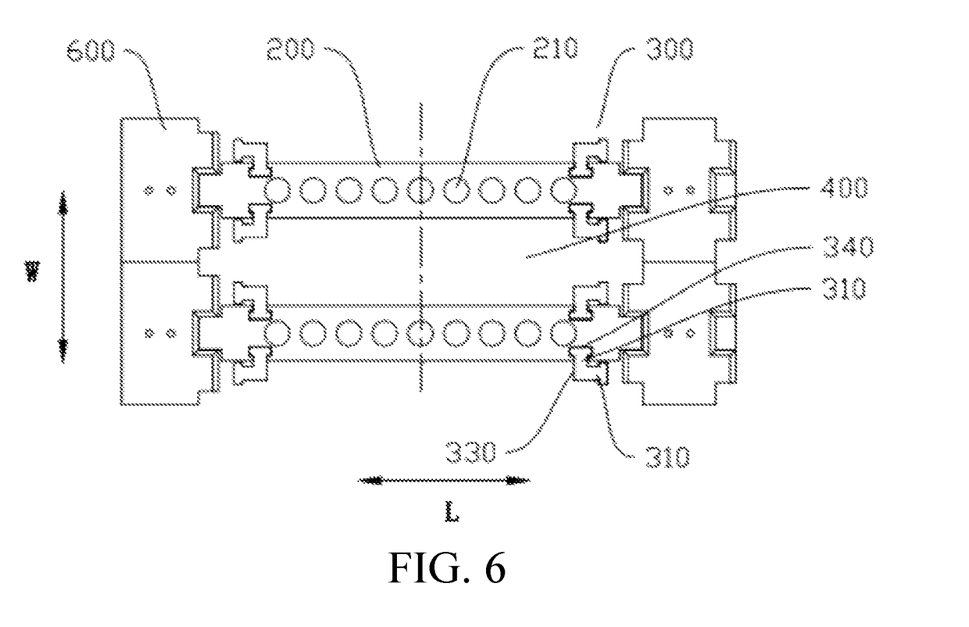
FIG. 6 shows a schematic structural diagram of a first accommodating cavity in a third implementation of a battery tray according to some embodiments of the present application.
Figure 7:
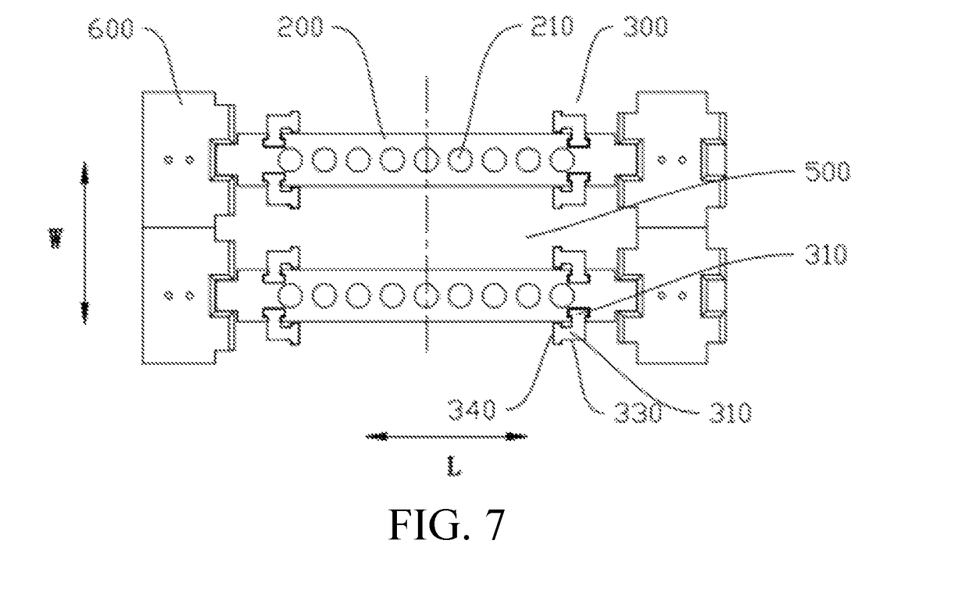
FIG. 7 shows a schematic structural diagram of a second accommodating cavity in the third implementation of the battery tray according to some embodiments of the present application.

In other embodiments, the limiting assembly 300 may be provided as shown in FIGS. 6 and 7. The limiting assembly 300 includes two first mounting portions 310 and two connection portions, where one ends of the connection portions are vertically connected to each other, and another ends of the connection portions are respectively connected to the two first mounting portions 310. One of the two connection portions is provided with a first limiting surface 330, and the first mounting portion 310 connected to the connection portion provided with the first limiting surface 330 is provided with a second limiting surface 340, where the first limiting surface 330 and the second limiting surface 340 are perpendicular to each other.

Preferably, in order to make the connection between the first mounting portion 310 and the supporting structure or the separator 200 more reliable, the two first mounting portions 310 are of the same size.

Figure 8:
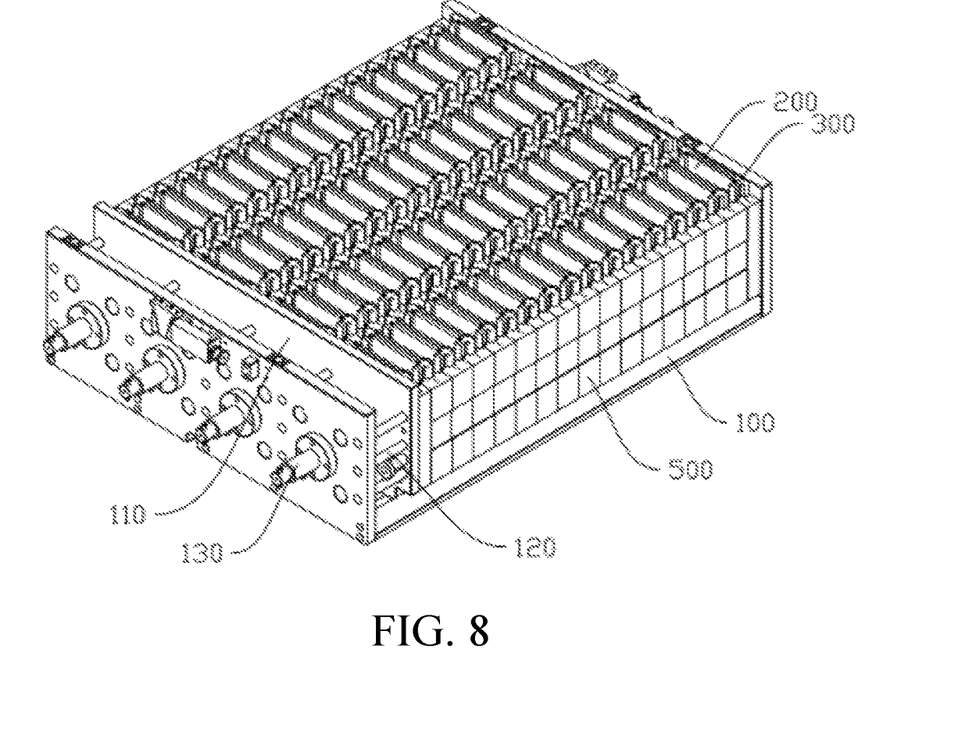
FIG. 8 shows a schematic structural diagram of a battery tray according to some embodiments of the present application.
Figure 9:
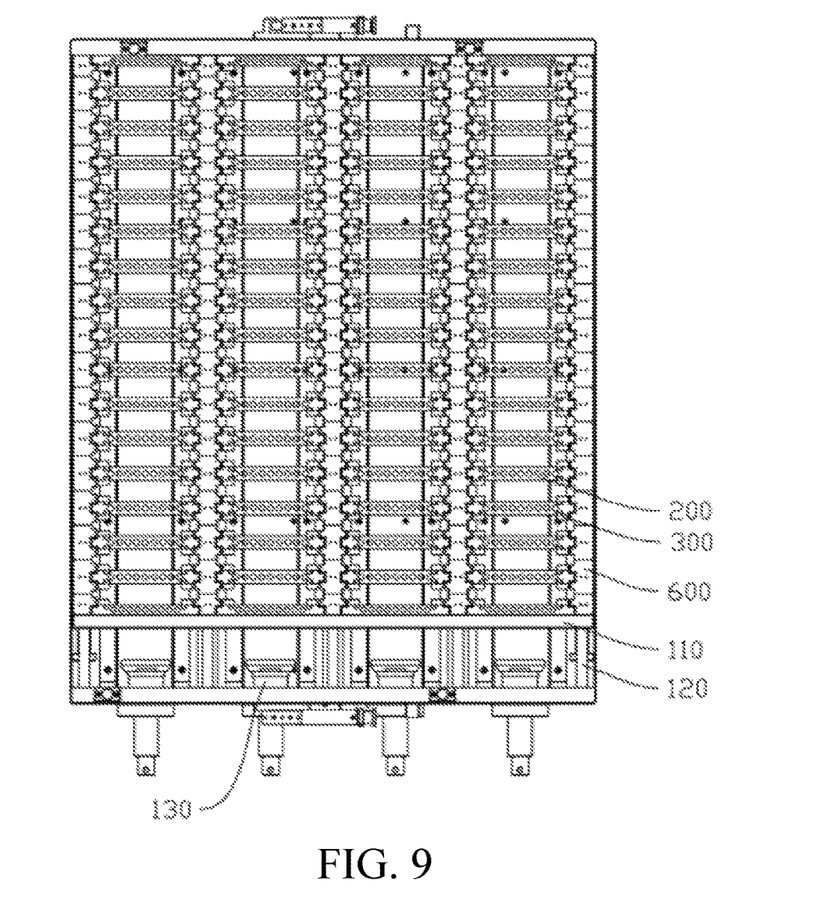
FIG. 9 shows a top view of a schematic structure of a battery tray according to some embodiments of the present application.

Referring to FIGS. 8 and 9, the supporting structure includes a pallet 100 and a side plate provided on the pallet 100. The side plate is connected to the separator 200, and the side plate and/or the separator 200 is connected to the pallet 100, so that the supporting structure is connected to the separator 200. In this connection manner, the separator 200, the side plate, and the pallet 100 can be assembled quickly and conveniently.

One of the separator 200, the side plate, and the pallet 100 is provided with a second mounting portion for connecting to the first mounting portion 310. One of the first mounting portion 310 and the second mounting portion is a groove, and the other is a protrusion, where the groove is engaged with the protrusion. In this connection manner, the limiting assembly 300 can be connected to at least the partition plate 200 or the side plate or the pallet 100.

Since the second mounting portion is fixedly connected to one of the separator 200, the side plate, and the pallet 100, that is, the position of the second mounting portion remains unchanged and there is only one second mounting portion, the battery tray of the present application has a simple structure without processing a plurality of second mounting portions, which can effectively reduce a processing difficulty and a processing cost of the battery tray, can also avoid the problem that the clamping force of the battery tray to the battery is unbalanced due to the existence of a vacant second mounting portion, and further reduce the possibility of the battery moving inside the accommodating cavity. With the present solution, compatibility with batteries having different sizes can be achieved only by adjusting the state of the limiting assemblies 300.

Referring to FIGS. 2 to 7, the limiting assembly 300 is detachably connected to the separator 200. Specifically, the limiting assembly 300 can be detachably connected to the separator 200 by the first mounting portion 310 of the limiting assembly 300 under the guidance of the groove of the separator 200.

Referring to FIGS. 10-13, the limiting assembly 300 is detachably connected to the pallet 100. Specifically, one of the limiting assembly 300 and the pallet 100 is provided with a mounting rod, and the other is provided with a mounting hole, where the mounting rod can be snapped into the mounting hole so that the limiting assembly 300 can be detachably connected to the pallet 100. The limiting assembly 300 is in the shape of a square, or a cross-section of the limiting assembly 300 is in the shape of T.

It may be contemplated that the limiting assembly 300 may also be detachably connected to the side panel.

Referring to FIGS. 8 and 9, the side plate includes a plurality of fixing blocks 600, the number of the separators 200 is a plurality, and both ends of each of the separators 200 in the longitudinal direction of the first accommodating cavity 400 are connected to two ones of the fixing blocks 600, respectively. Preferably, the fixing blocks 600 are connected to the pallet 100, and the separators 200 are connected to the pallet 100 by the fixing blocks 600. The plurality of fixing blocks 600, the plurality of separators 200, and the plurality of limiting assemblies 300 are arranged in the W direction and the L direction as shown, so that a plurality of first accommodating cavities 400 or a plurality of second accommodating cavities 500 arranged vertically and horizontally can be formed. That is, the battery tray is formed with a plurality of rows and columns of first accommodating cavities 400 or second accommodating cavities 500 for receiving batteries.

It can be understood that one sliding mechanism is formed between one end of each of the separators 200 and the fixing block 600, and another sliding mechanism is formed between the other end of the separator 200 and another fixing block 600, and the sliding mechanisms facilitate assembly of the separator 200 and the fixing blocks 600. The sliding mechanisms are a groove and a protrusion which are mutually matched.

The battery tray further includes an adjustment assembly connected to the fixing blocks 600 to adjust a distance between the adjacent ones of the separators 200 so that the adjacent separators 200 clamp or release the batteries to fix the batteries onto the pallet 100.

The adjustment assembly includes a guide rod 120, a driving assembly 130 and two baffles 110. The driving assembly 130 is connected to one of the two baffles 110 that is provided with a guide hole mutually matched with the guide rod 120. The guide rod 120 is connected to the fixing blocks 600, the driving assembly 130 is used to drive movement of the baffle 110 to adjust the distance between the adjacent separators 200. The adjacent separators 200 clamp and fix the battery onto the pallet 100.

In the present embodiment, the number of columns of guide rods 120 and the number of columns of fixing blocks 600 each are five columns, and one column of separator 200 is provided between two adjacent columns of the guide rod 120 or the two adjacent columns of fixing blocks 600, so that the number of columns of separators 200 and the number of columns of batteries that the battery tray can carry each are four columns. Each column of guide rods 120 includes three guide rods 120 arranged at an upper level, a middle level and a lower level. Each of the fixing block 600 is provided with guide holes distributed at the upper level, the middle level, and the lower level. The three guide rods 120 penetrate through the three guide holes respectively provided on the same fixing block 600. The cross-section of the guide rod 120 may be circular or square.

The separator 200 is provided with a plurality of breathable holes 210 extending through upper and lower end surfaces of the separator 200. The breathable holes 210 serve to reduce a weight and fluid air. When the batteries are processed in a formation processing, the heat is transferred to the separators 200, and the air passing through the breathable holes 210 can carry away the heat of the separators 200, thereby facilitating cooling of the separators 200 and the batteries.

The upper surface of the pallet 100 is provided with a plurality of chutes arranged in a left and right distribution. The chutes extend in the width direction of the first accommodating cavity or the second accommodating cavity while the length direction of each of the chutes is the same as the length direction of the guide rod 120. Lower ends of the separators 200 and lower ends of the fixing blocks 600 extend into the chutes, and the chutes serve to guide the separators 200 and the fixing blocks 600 so that the separators 200 or the fixing blocks 600 in the same column are brought together in the same direction.

A specific operation principle of the battery tray will be described below.

For an embodiment in which the first limiting surface 330 and the second limiting surface 340 are disposed at two opposite end surfaces of the same limiting assembly 300, respectively, a method for adjusting the limiting assembly 300 includes following cases.

In a first case, referring to FIGS. 2-5 and 12-13, adjustment of the first accommodating cavity 400 or the second accommodating cavity 500 is implemented by performing the position interchanging of the limiting members 300 located at the first position and the second position, and the first position and the second position are both ends of the first accommodating cavity 400 or the second accommodating cavity 500 in the length direction of the first accommodating cavity 400 or the second accommodating cavity 500.

In a second case, referring to FIGS. 2-5, adjustment of the first accommodating cavity 400 or the second accommodating cavity 500 is implemented by withdrawing the pair of limiting assemblies 300 from the second mounting portion, rotating each of the pair of limiting assemblies 300 by 180° with respect to its second axis, and then inserting the pair of rotated limiting assemblies 300 into the second mounting portion. The second axis extends in the width direction of the first accommodating cavity 400 or the second accommodating cavity 500 and is located within a mounting plane of the first mounting portion 310, where the mounting plane refers to a central surface of the first mounting portion 310 extending in the height direction of the first accommodating cavity 400 or the second accommodating cavity 500 when the first mounting portion 310 is connected with the separator 200.

Figure 12:
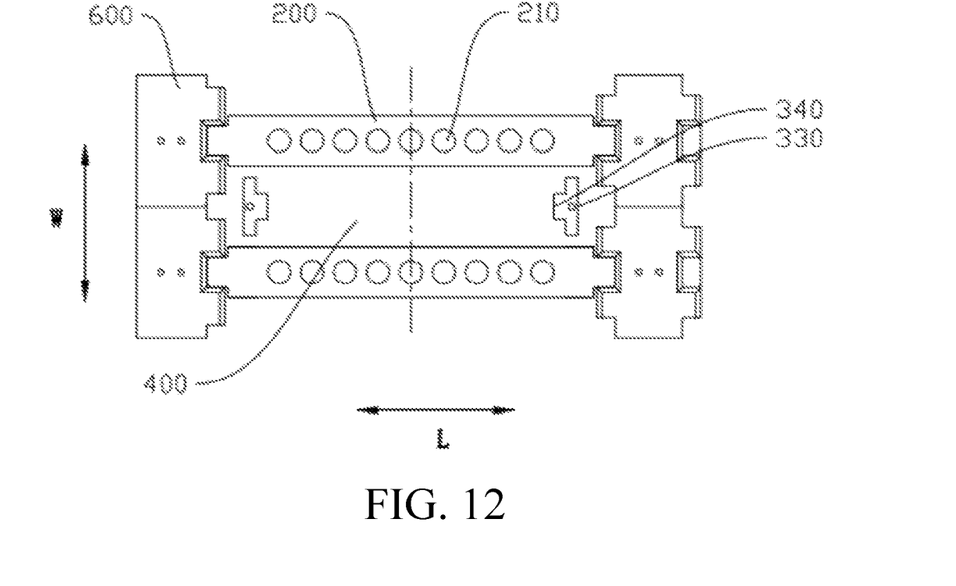
FIG. 12 shows a schematic structural diagram of a first accommodating cavity in a sixth implementation of a battery tray according to some embodiments of the present application.
Figure 13:
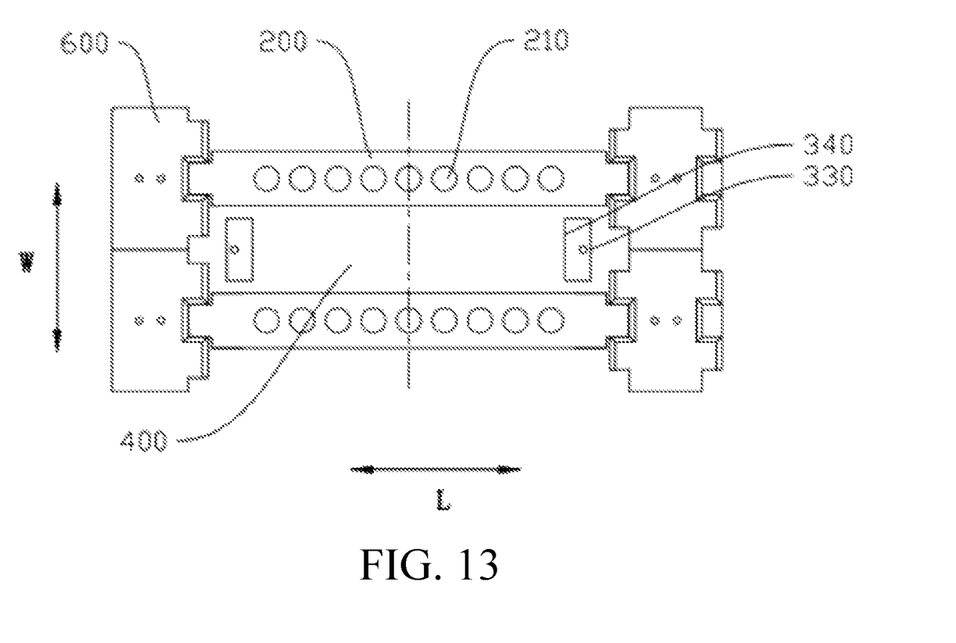
FIG. 13 shows a schematic structural diagram of a first accommodating cavity in a seventh implementation of a battery tray according to some embodiments of the present application.

Alternatively, referring to FIGS. 12 and 13, the first mounting portion 310 of the limiting assembly 300 is the mounting hole or the mounting column provided in the limiting portion 320. The first mounting portion 310 is connected to the pallet 100, and the distance between the first limiting surface 330 and the first mounting portion 310 is not equal to that between the second limiting surface 340 and the first mounting portion 310. The adjustment of the first accommodating cavity 400 or the second accommodating cavity 500 can be implemented by withdrawing the pair of limiting assemblies 300 from the second mounting portion, rotating each of the pair of limiting assemblies 300 by 180° with respect to its second axis, and then inserting the pair of rotated limiting assemblies 300 into the second mounting portion. The second axis extends in the width direction of the first accommodating cavity 400 or the second accommodating cavity 500 and is located within a central surface of the first mounting portion 310 in the height direction of the first accommodating cavity 400 or the second accommodating cavity 500.

In a third case, referring to FIGS. 4 and 5, one limiting assembly 300 is provided with two first mounting portions 310 arranged in the width direction of the first accommodating cavity 400 or second accommodating cavity 500, and the two first mounting portions 310 are respectively provided on both sides of the limiting portion 320. One of the first mounting portions 310 is connected to the separators 200 to form the first accommodating cavity 400. A pair of limiting assemblies 300 is withdrawn from the second mounting portion and respectively rotated by 180° with respect to their first axes, and the pair of rotated limiting assemblies is inserted into the second mounting portion, so that another mounting portion 310 is connected with the separators 200 to form the second accommodating cavity 500. The first axes extend in the height direction of the first accommodating cavity 400 or second accommodating cavity 500 and are located at the intersection of the centerline of the limiting portion 320 in the length direction of the first accommodating cavity 400 or second accommodating cavity 500 and the centerline of the first mounting portion 310 in the width direction of the first accommodating cavity 400 or second accommodating cavity 500.

Alternatively, referring to FIGS. 12 and 13, the first mounting portion 310 of the limiting assembly 300 is the mounting hole or the mounting column provided in the limiting portion 320. The first mounting portion 310 is connected to the pallet 100, and the distance between the first limiting surface 330 and the first mounting portion 310 is not equal to that between the second limiting surface 340 and the first mounting portion 310. The adjustment of the first accommodating cavity 400 or the second accommodating cavity 500 can be implemented by withdrawing the pair of limiting assemblies 300 from the second mounting portion, rotating each of the pair of limiting assemblies 300 by 180° with respect to its first axis, and then inserting the pair of rotated limiting assemblies 300 into the second mounting portion. The first axis extends in the height direction of the first accommodating cavity 400 or the second accommodating cavity 500, and is collinear with the centerline of the first mounting portion 310.

For another embodiment in which the first limiting surface 330 and the second limiting surface 340 are disposed at two mutually perpendicular end surfaces of the same limiting assembly 300, respectively, a method for adjusting the limiting assembly 300 includes following cases.

Referring to FIGS. 6 and 7, The limiting assembly 300 includes two first mounting portions 310 and two connection portions, where one ends of the connection portions are vertically connected to another connection portion, and another ends of the connection portions are respectively connected to the first mounting portions 310. One of the two connection portions is provided with the first limiting surface 330, and the first mounting portion 310 connected to the connection portion provided with the first limiting surface 330 is provided with the second limiting surface 340. Each limiting assembly 300 of the pair of limit assemblies 300 is connected to the separator 200 by one of the first mounting portions 310 to form the first accommodating cavity 400. At this time, the adjustment of the first accommodating cavity 400 or the second accommodating cavity 500 can be implemented by withdrawing the pair of limiting assemblies 300 from the second mounting portion, rotating one limiting assembly 300 of the pair of limiting assemblies 300 by 90° with respect to the forward direction of its own third axis, rotating another limiting assembly 300 by 90° with respect to the reverse direction of its own third axis, and another first mounting portion of each limiting assembly 300 of the pair of limiting assemblies 300 into the second mounting portion. The third axis extends in the height direction of the first accommodating cavity 400 or the second accommodating cavity 500, and is provided at the intersection of centerlines of the two first mounting portions 310. That is, the centerline of the first mounting portion 310 connected with the separator 300 when the first mounting portion 310 is connected with the separator 300 refers to a centerline of the first mounting portion 310 in the width direction of the first accommodating cavity 400 or the second accommodating cavity 500, and the centerline of another mounting portion 310 refers to a centerline of the another mounting portion 310 in the length direction of the first accommodating cavity 400 or the second accommodating cavity 500.

Alternatively, referring to FIGS. 10 and 11, the first mounting portion 310 of the limiting assembly 300 is the mounting hole or the mounting column provided in the limiting portion 320. The first mounting portion 310 is connected to the pallet 100, and the distance between the first limiting surface 330 and the first mounting portion 310 is not equal to that between the second limiting surface 340 and the first mounting portion 310. The adjustment of the first accommodating cavity 400 or the second accommodating cavity 500 can be implemented by withdrawing the pair of limiting assemblies 300 from the second mounting portion, rotating one limiting assembly 300 of the pair of limiting assemblies 300 by 90° with respect to the forward direction of its own third axis, rotating another limiting assembly 300 by 90° with respect to the reverse direction of its own third axis, and then inserting the pair of limiting assemblies 300 into the second mounting portion. The third axis is collinear with the centerline of the first mounting portion 310.

Any combination of the technical features in the foregoing embodiments may be performed. For brevity of description, all possible combinations of the technical features in the foregoing embodiments are not described. However, as long as there is no contradiction among the combination of the technical features, it should be considered as the scope described in this specification.

Of course, the present application is not limited to the above embodiments. Those skilled in the art can further make various equivalents and substitutions without departing from the spirit of the present application, which equivalents and substitutions are included within the scope of the claims.

What is claimed is:

1. A model changing method, wherein the method is applied to a battery tray, the battery tray comprises at least one pair of limiting assemblies and a separator assembly, the separator assembly comprises a supporting structure and at least two separators, the supporting structure is connected to the at least two separators, each of the limiting assemblies is provided with a first limiting surface and a second limiting surface;
    wherein each of the limiting assemblies comprises a first mounting portion and a limiting portion, the first mounting portion is connected with the limiting portion and configured to be connected with the supporting structure or the separators, and the first limiting surface and the second limiting surface are two opposite end surfaces of the same limiting portion or the first limiting surface and the second limiting surface are two end surfaces of the same limiting portion being perpendicular to each other; or
    wherein each of the limiting assemblies comprises two first mounting portions and two connection portions, one ends of the connection portions are vertically connected to each other, and another ends of the connection portions are respectively connected to the two first mounting portions, one of the two connection portions is provided with a first limiting surface, and the first mounting portion connected to the connection portion provided with the first limiting surface is provided with a second limiting surface, and the first limiting surface and the second limiting surface are perpendicular to each other;
    the method comprises:
    limiting a limited member by a pair of limiting assemblies, wherein;
    two first limiting surfaces of the pair of limiting assemblies are disposed opposite each other to form a first accommodating cavity, wherein the first accommodating cavity has a length of L1; and
    adjusting a state of the pair of limiting assemblies so that two second limiting surfaces of the pair of limiting assemblies are disposed opposite each other to form a second accommodating cavity, wherein the second accommodating cavity has a length of L2, and L1 is not equal to L2.

2. The method of claim 1, wherein the first limiting surface and the second limiting surface are two opposite end surfaces of the same limiting assembly, the pair of limiting assemblies are located at a first position and a second position, respectively, and adjusting the state of the pair of limiting assemblies comprises:
    moving one limiting assembly located at the first position to the second position and moving another limiting assembly located at the second position to the first position, so that the two second limiting surfaces of the pair of limiting assemblies are disposed opposite each other and form the second accommodating cavity.

3. The method of claim 2, wherein adjusting the state of the pair of limiting assemblies further comprises:
    moving the another limiting assembly located at the second position to a third position, moving the one limiting assembly located at the first position to the second position, and then moving the another limiting assembly located at the third position to the first position, so that the two second limiting surfaces of the pair of limiting assemblies are disposed opposite each other and form the second accommodating cavity, wherein the third position is an outer area of the first accommodating cavity or the second accommodating cavity.

4. The method of claim 1, wherein the first limiting surface and the second limiting surface are two opposite end surfaces of the same limiting assembly, the pair of limiting assemblies each have a first axis extending in a height direction of the first accommodating cavity, and adjusting the state of the pair of limiting assemblies further comprises:
rotating each of the pair of limiting assemblies by 180° with respect to its first axis as a rotation axis, so that the two second limiting surfaces of the pair of limiting assemblies are disposed opposite each other and form the second accommodating cavity.

5. The method of claim 1, wherein the first limiting surface and the second limiting surface are two opposite end surfaces of the same limiting assembly, the pair of limiting assemblies each have a second axis extending in a width direction of the first accommodating cavity, and adjusting the state of the pair of limiting assemblies further comprises:
rotating each of the pair of limiting assemblies by 180° with respect to its second axis as a rotation axis, so that the two second limiting surfaces of the pair of limiting assemblies are disposed opposite each other and form the second accommodating cavity.

6. The method of claim 1, wherein the first limiting surface and the second limiting surface are perpendicular to each other, the pair of limiting assemblies each have a third axis extending in the height direction of the first accommodating cavity, and adjusting the state of the pair of limiting assemblies further comprises:
rotating one limiting assembly of the pair of limiting assemblies by 90° with respect to the forward direction of its third axis and another limiting assembly of the pair of limiting assemblies by 90° with respect to the reverse direction of its third axis, so that the two second limiting surfaces of the pair of limiting assemblies are disposed opposite each other and form the second accommodating cavity.

7. A battery tray, comprising at least one pair of limiting assemblies and a separator assembly, wherein the separator assembly comprises a supporting structure and at least two separators, the supporting structure is connected to the at least two separators, each of the limiting assemblies is provided with a first limiting surface and a second limiting surface, each of the limiting assemblies comprises a first mounting portion and a limiting portion, the first mounting portion is connected with the limiting portion and configured to be connected with the supporting structure or the separators, and the first limiting surface and the second limiting surface are two opposite end surfaces of the same limiting portion or the first limiting surface and the second limiting surface are two end surfaces of the same limiting portion being perpendicular to each other; or
wherein each of the limiting assemblies comprises two first mounting portions and two connection portions, one ends of the connection portions are vertically connected to each other, and another ends of the connection portions are respectively connected to the two first mounting portions, one of the two connection portions is provided with a first limiting surface, and the first mounting portion connected to the connection portion provided with the first limiting surface is provided with a second limiting surface, and the first limiting surface and the second limiting surface are perpendicular to each other;
the at least one pair of limiting assemblies is connected to the supporting structure or the separators, two first limiting surfaces of the pair of limiting assemblies are disposed opposite each other to form a first accommodating cavity in combination with two ones of the separators, the first accommodating cavity has a length of L1, or two second limiting surfaces of the pair of limiting assemblies are disposed opposite each other to form a second accommodating cavity in combination with two ones of the separators, the second accommodating cavity has a length of L2, and L1 is not equal to L2.

8. The battery tray of claim 7, wherein the supporting structure comprises a pallet and a side plate, the side plate is connected with the separators, and the side plate and/or the separators are connected to the pallet, so that one of the separator, the side plate, and the pallet is provided with a second mounting portion for connecting to the first mounting portion, one of the first mounting portion and the second mounting portion is a groove, and another one of the first mounting portion and the second mounting portion is a protrusion.

9. A battery tray, comprising at least one pair of limiting assemblies and a separator assembly, wherein the separator assembly comprises a supporting structure and at least two separators, the supporting structure is connected to the at least two separators, each of the limiting assemblies is provided with a first limiting surface and a second limiting surface, each of the limiting assemblies comprises a first mounting portion and a limiting portion, the first mounting portion is connected with the limiting portion and configured to be connected with the supporting structure or the separators, and the first limiting surface and the second limiting surface are two opposite end surfaces of the same limiting portion or the first limiting surface and the second limiting surface are two end surfaces of the same limiting portion being perpendicular to each other; or
wherein each of the limiting assemblies comprises two first mounting portions and two connection portions, one ends of the connection portions are vertically connected to each other, and another ends of the connection portions are respectively connected to the two first mounting portions, one of the two connection portions is provided with a first limiting surface, and the first mounting portion connected to the connection portion provided with the first limiting surface is provided with a second limiting surface, and the first limiting surface and the second limiting surface are perpendicular to each other;
the at least one pair of limiting assemblies is connected to the supporting structure or the separators, two first limiting surfaces of the pair of limiting assemblies are disposed opposite each other to form a first accommodating cavity in combination with two ones of the separators, the first accommodating cavity has a length of L1, or two second limiting surfaces of the pair of limiting assemblies are disposed opposite each other to form a second accommodating cavity in combination with two ones of the separators, the second accommodating cavity has a length of L2, and L1 is not equal to L2;
wherein the supporting structure comprises a pallet and a side plate, the side plate is connected with the separators, and the side plate and/or the separators are connected to the pallet, so that one of the separator, the side plate, and the pallet is provided with a second mounting portion for connecting to the first mounting portion, one of the first mounting portion and the second mounting portion is a groove, and another one of the first mounting portion and the second mounting portion is a protrusion; and
wherein the side plate comprises a plurality of fixing blocks, the number of the separators is a plurality, and both ends of each of the separators in a length direction of the first accommodating cavity are connected to two of the fixing blocks, respectively, the battery tray further comprises an adjustment assembly, the adjustment assembly is connected with the fixing blocks to adjust a distance between adjacent ones of the separators so that the adjacent ones clamp or release a battery.

10. The battery tray of claim 9, wherein the adjustment assembly comprises a guide rod, a driving assembly, and two baffles, the driving assembly is connected to one of the two baffles that is provided with a guide hole mutually matched with the guide rod, the guide rod is connected to the fixing blocks, and the driving assembly is configured to drive movement of the baffle to adjust the distance between the adjacent separators.

* * * * *